United States Patent
Ran et al.

(10) Patent No.: US 9,214,898 B2
(45) Date of Patent: Dec. 15, 2015

(54) TRIPLE CASCODE POWER AMPLIFIER

(71) Applicant: Realtek Semiconductor Corp., Hsinchu (TW)

(72) Inventors: Gen-Sheng Ran, Hsin Chu (TW); Po-Chih Wang, Kaohsiung (TW); Ka-Un Chan, Chu Pei (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/158,009

(22) Filed: Jan. 17, 2014

(65) Prior Publication Data

US 2014/0210560 A1    Jul. 31, 2014

(30) Foreign Application Priority Data

Jan. 31, 2013    (TW) ............... 102103624 A

(51) Int. Cl.
*H03F 3/04*    (2006.01)
*H03F 1/22*    (2006.01)
*H03F 3/45*    (2006.01)

(52) U.S. Cl.
CPC ............ *H03F 1/223* (2013.01); *H03F 3/45179* (2013.01); *H03F 2200/09* (2013.01); *H03F 2200/18* (2013.01); *H03F 2200/372* (2013.01); *H03F 2200/555* (2013.01); *H03F 2203/45292* (2013.01); *H03F 2203/45394* (2013.01); *H03F 2203/45701* (2013.01); *H03F 2203/45731* (2013.01)

(58) Field of Classification Search
CPC .......... H03F 2200/294; H03F 3/45475; H03F 3/45179; H03F 3/195; H03F 1/26; H03F 3/211; H03F 2200/372; H03F 2203/45138; H03F 3/193; H03F 3/45183; H03F 1/223; H03F 2200/451; H03F 2203/45288
USPC ........... 330/85, 116, 117, 253, 260, 275, 301, 330/311
See application file for complete search history.

(56) References Cited

U.S. PATENT DOCUMENTS

| | | | | |
|---|---|---|---|---|
| 7,248,120 | B2 * | 7/2007 | Burgener et al. | 330/311 |
| 7,821,339 | B1 * | 10/2010 | Afsahi | 330/253 |
| 8,779,859 | B2 * | 7/2014 | Su et al. | 330/311 |
| 8,847,351 | B2 * | 9/2014 | Klemens et al. | 257/531 |

* cited by examiner

*Primary Examiner* — Khanh V Nguyen
(74) *Attorney, Agent, or Firm* — Muncy, Geissler, Olds & Lowe, P.C.

(57) ABSTRACT

A triple cascode power amplifier is provided. The triple cascode power amplifier includes a first-stage transistor pair, a second-stage transistor pair and a third-stage transistor pair. The first-stage transistor pair comprises two first-stage transistors that respectively receive two dynamic bias voltages with opposite polarities. The second-stage transistor pair is coupled with the first-stage transistor pair to form a first node and comprise two second-stage transistors coupled with each other to form a second node. The third-stage transistor pair is coupled with the second-stage transistor pair and comprises two third-stage transistors for outputting a differential signal. The first-stage transistor pair and the second-stage transistor pair are low voltage components while the third-stage transistor pair is a high voltage component. The power amplifier transforms the differential signal into a single-ended signal for output.

8 Claims, 5 Drawing Sheets

US 9,214,898 B2

TRIPLE CASCODE POWER AMPLIFIER

This application claims the benefit of the filing date of Taiwan Application Ser. No. 102103624, filed on Jan. 31, 2013, the content of which is incorporated herein by reference.

BACKGROUND OF THE INVENTION

1. Field of the Invention

The invention relates to an electronic device, and more particularly, to a power amplifier.

2. Description of the Related Art

A conventional power amplifier generally uses a transistor cascode constructed from two transistors connected in series for realization in view of stability and frequency responses. However, in an advanced manufacturing process, a conventional cascade power amplifier faces a problem that a voltage shift occurs at connection nodes of the transistor cascode, causing the voltages of output differential signal to shift as well. It is hard to meet the reliability requirement of transistor devices.

Accordingly, what is needed is a power amplifier with a more than two-stage cascade configuration to address the above-identified problems. The invention addresses such a need.

SUMMARY OF THE INVENTION

In view of the above-mentioned problems, an object of the invention is to provide a cascode configuration with three or more transistors connected in series, increasing the reliability of transistors in operation and maintaining the stability, the gain and the frequency response without affecting linearity.

One embodiment of the invention provides a triple cascode power amplifier. The triple cascode power amplifier includes a first-stage transistor pair, a second-stage transistor pair and a third-stage transistor pair. The first-stage transistor pair comprises two first-stage transistors that respectively receive two dynamic bias voltages with opposite polarities. The second-stage transistor pair is coupled with the first-stage transistor pair to form a first node and comprise two second-stage transistors coupled with each other to form a second node. The third-stage transistor pair is coupled with the second-stage transistor pair and comprises two third-stage transistors for outputting a differential signal. The first-stage transistor pair and the second-stage transistor pair are low voltage components while the third-stage transistor pair is a high voltage component. The power amplifier transforms the differential signal into a single-ended signal for output.

Another embodiment of the invention provides a multiple stage cascode power amplifier. The multiple stage cascode power amplifier comprises at least one first-stage transistor pair, at least one second-stage transistor pair and a third-stage transistor pair. Each first-stage transistor pair comprises two first-stage transistors that respectively receive two dynamic bias voltages with opposite polarities. Each second-stage transistor pair is coupled with corresponding first-stage transistor pair to form at least one first node and comprises two second-stage transistors coupled with each other to form a second node. The third-stage transistor pair is coupled with one of the at least one second-stage transistor pair, the third-stage transistor pair comprises two third-stage transistors for outputting a differential signal. Here, the at least one first-stage transistor pair and the at least one second-stage transistor pair are low voltage components while the third-stage transistor pair is a high voltage component. Each of the second-stage transistors receives a control signal at a corresponding second node to control a voltage across a corresponding first-stage transistor within a predetermined range. The power amplifier transforms the differential signal into a single-ended signal for output.

Another embodiment of the invention provides a triple cascade power amplifier. The triple cascade power amplifier comprises a first-stage transistor pair, a second-stage transistor pair and a third-stage transistor pair. The first-stage transistor pair comprises two first-stage transistors, gates of which respectively receive a first gate voltage. The second-stage transistor pair is coupled with the first-stage transistor pair and comprises two second-stage transistors. The third-stage transistor pair is coupled with the second-stage transistor pair and comprises two third-stage transistors for outputting a differential signal. Here, the first-stage transistor pair and the second-stage transistor pair are low voltage components while the third-stage transistor pair is a high voltage component. Gates of the two second-stage transistors receive a control signal to control voltages across the two first-stage transistors within a predetermined range, and wherein the first gate voltages are provided according to the control signal.

According to an embodiment of the invention, a power amplifying device with a three-or-more-stage cascode configuration uses a control signal to control voltages across a transistor cascode within a predetermined range. It causes the voltages not to exceed an upper limit of reliability, thereby solving the problem that a voltage shift occurs at connection nodes of the transistor cascode in the prior art.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
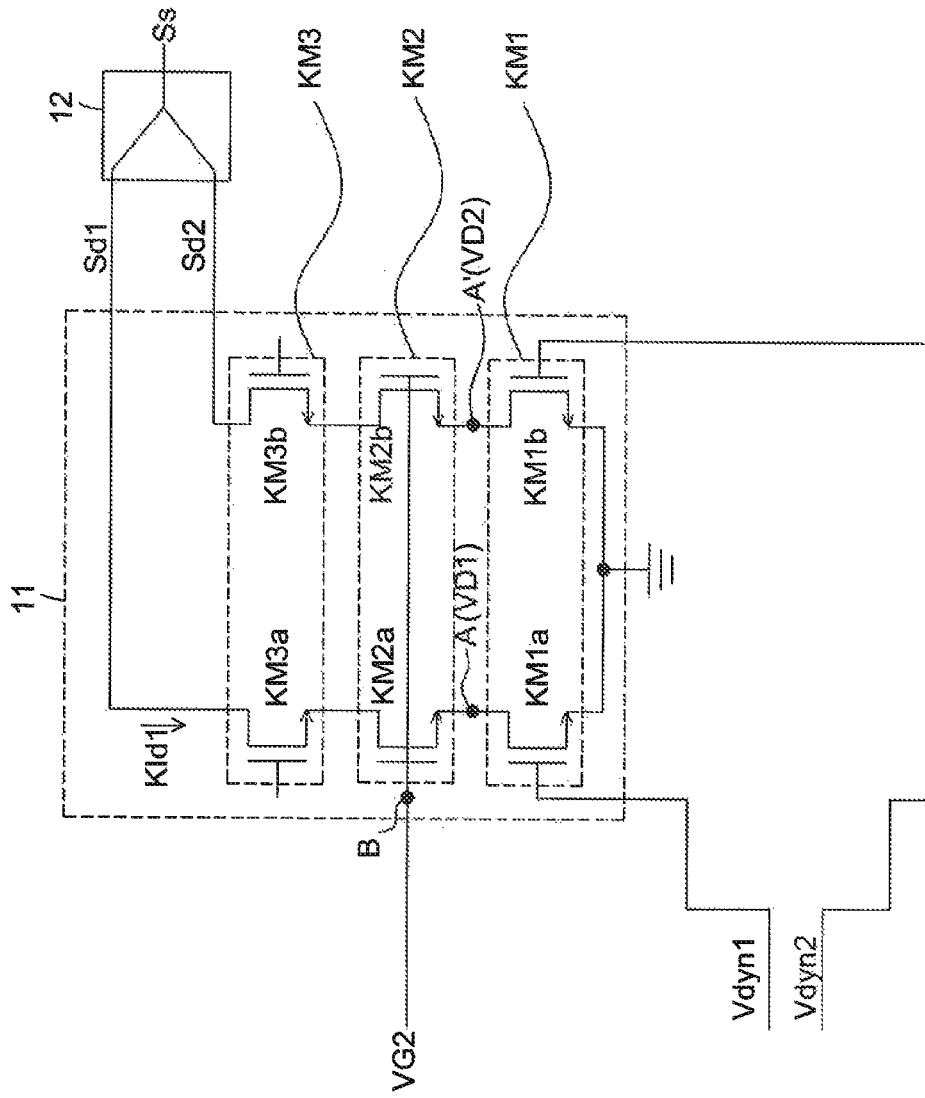
FIG. 1 is a schematic diagram showing a triple cascode power amplifier according to an embodiment of the invention.

FIG. 1 is a schematic diagram showing a triple cascade power amplifier according to an embodiment of the invention. The power amplifying device 10 includes a transistor cascade unit 11 and a balance to unbalance unit 12.

The transistor cascode unit 11 includes a first-stage transistor pair KM1, a second-stage transistor pair KM2 and a third-stage transistor pair KM3.

The first-stage transistor pair KM1 is low voltage component and include two first-stage transistors KM1a and KM1b for respectively receiving two dynamic bias voltages Vdyn1 and Vdyn2 with opposite polarities.

The second-stage transistor pair KM2 is low voltage component and coupled with the first-stage transistor pair KM1 to form a first node A. The first node A is grounded through the first-stage transistor KM1a. The second-stage transistor pair KM2 include two second-stage transistors KM2a and KM2b, two gates of which form a second node B.

The first-stage transistor pair KM1 and the second-stage transistor pair KM2 use low voltage components to cause the corresponding node to have smaller parasitic capacitance and need a smaller voltage drop.

The third-stage transistor pair KM3 is coupled with the second-stage transistor pair KM2. The third-stage transistor pair KM3 is a high voltage component, e.g., capable of sustaining a larger voltage swing. The third-stage transistor pair KM3 includes two second-stage transistors KM3a and KM3b for generating a differential signal Sd1 and Sd2.

The balance to unbalance unit 12 receives and transforms the differential signal Sd1 and Sd2 into a single-ended signal Ss.

In an embodiment, the transistors of the first-stage transistor pair KM1 and the second-stage transistor pair KM2 are implemented by core devices which are low voltage components, to thereby have smaller parasitic capacitance. Besides, the transistor sizes of the second-stage transistor pair KM2 are large enough to cause its low-impedance characteristic not to affect the linearity. The transistors of the third-stage transistor pair KM1 are implemented by i/o devices which are high voltage components, to thereby sustain the radiation energy of output signals.

Hereinafter, the operations of the left-hand side circuit of the transistor cascode unit 11 including transistors KM3a, KM2a, KM1a are described below. Since the right-hand side circuit of the transistor cascode unit 11 has the same operations as the left-hand side circuit, its detailed description is omitted herein.

During operation, the second-stage transistor KM2a in the left-hand side circuit of the transistor cascode unit 11 receives a control signal VG2 at the second node B. Since the first-stage transistor KM1a is grounded, the current Kid1 flowing through the transistors KM3a, KM2a, KM1a can be controlled by the control signal VG2, to thereby control a voltage VD1 at the first node A with respect to ground, i.e., controlling a voltage VDS (not shown) across the first-stage transistor KM1a. For example, the voltage VD1 at the first node A with respect to ground is controlled within a predetermined range, causing the voltage VD1 not to exceed the upper limit of reliability. Likewise, a voltage VD2 at the first node A' with respect to ground (i.e., a voltage VDS (not shown) across the first-stage transistor KM1b) is controlled within a predetermined range, causing the voltage VD2 not to exceed the upper limit of reliability.

In this manner, the triple cascade power amplifier can solve the problem that a voltage shift occurs at connection nodes of the existing transistor cascade, thus stabling the output signal, improving the stability and reliability of the cascode power amplifying device.

Figure 2A:
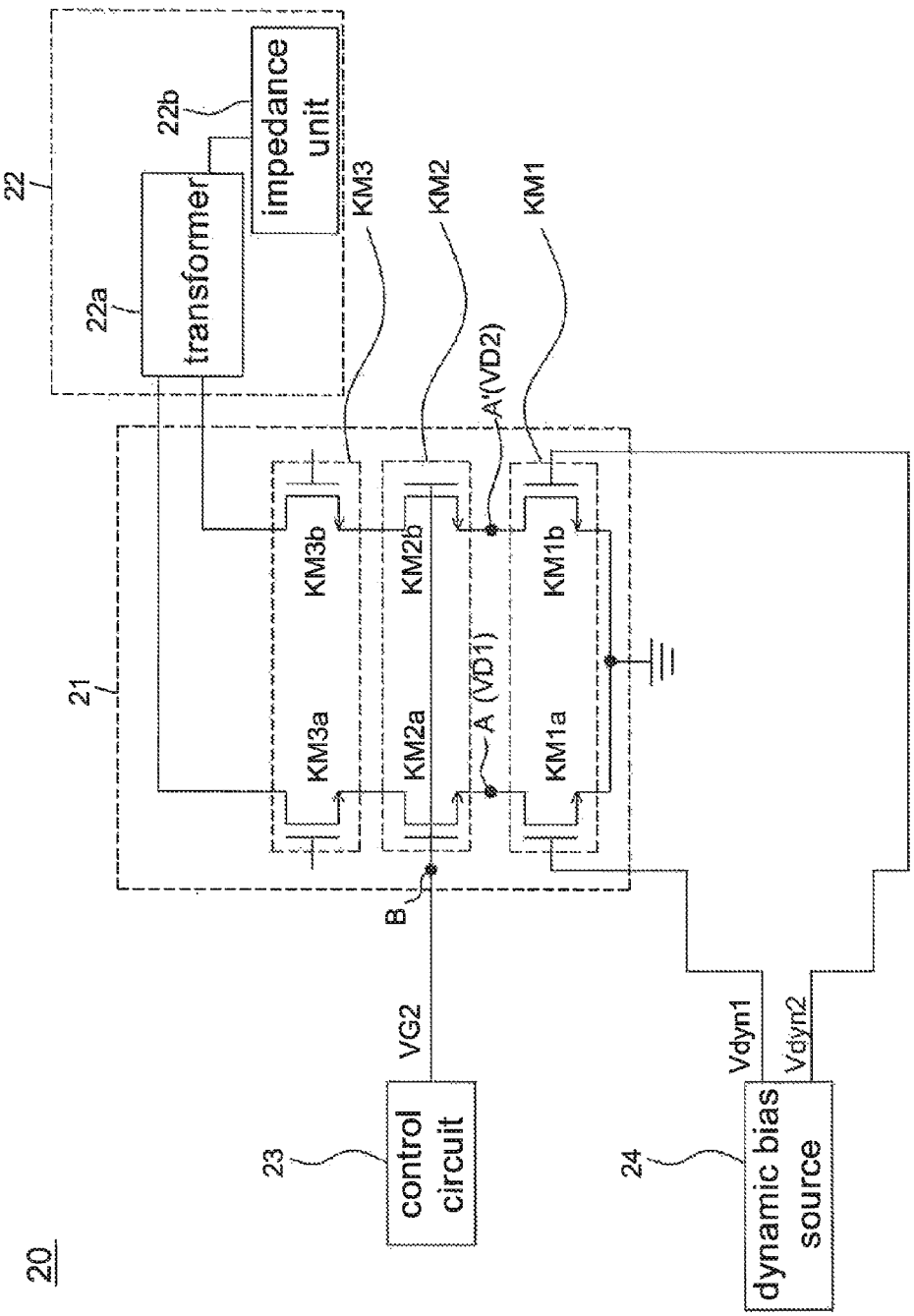
FIG. 2A is a schematic diagram showing a triple cascode power amplifier according to an embodiment of the invention.

FIG. 2A is a schematic diagram showing a triple cascode power amplifier according to an embodiment of the invention. The power amplifying device 20 includes a transistor cascode unit 21, a balance to unbalance unit 22, a control circuit 23 and a dynamic bias source 24.

The operations of the triple cascode power amplifying device 20 are roughly the same as those of the triple cascode power amplifying device 10. The triple cascade power amplifying device 20 is provided by way of example. In the triple cascade power amplifying device 20, the control circuit 23 is used to generate a control signal VG2 to control the voltages VD1 and VD2 at the first nodes A and A' within a predetermined range, i.e., controlling two voltages (not shown) across the first-stage transistors KM1a and KM1b within a predetermined range. It causes the voltages VD1 and VD2 not to exceed the upper limit of reliability, thereby solving the problem that a voltage shift occurs at connection nodes of the transistor cascade in the prior art. Further, the dynamic bias source 24 is used to supply two dynamic bias voltages Vdyn1 and Vdyn2 with opposite polarities to the first-stage transistor pair KM1. Further, in this embodiment, the balance to unbalance unit 22 includes a transformer 22a and an impedance unit 22b. For example, the impedance unit 22b can be a 50 ohm resistor; however, it is not limitation of the invention and the impedance unit 22b can be implemented by a resistor having other resistance value.

Figure 2B:
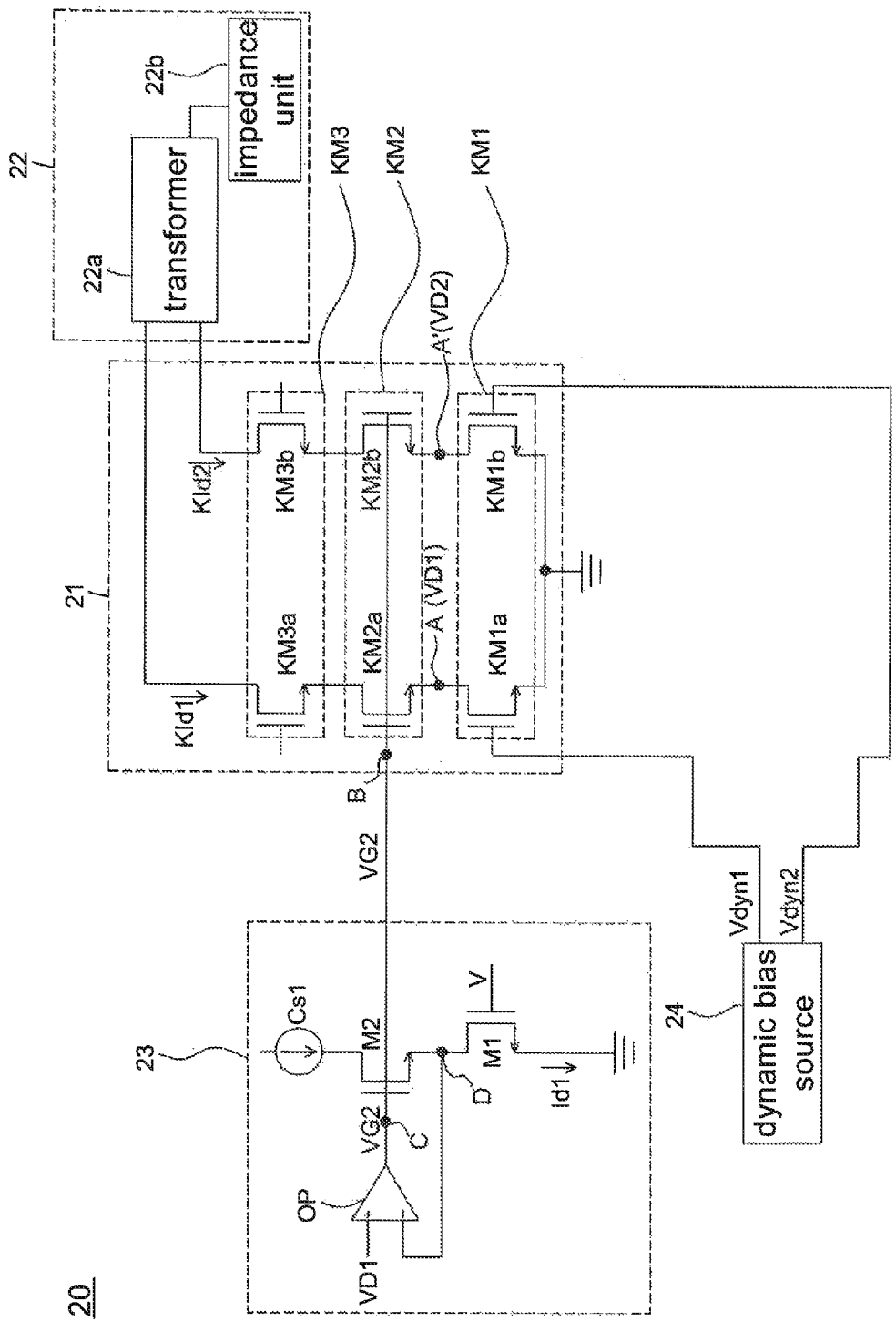
FIG. 2B is a schematic diagram showing the control circuit 23 of the triple cascode power amplifying device 20 according to an embodiment of the invention.

FIG. 2B is a schematic diagram showing the control circuit 23 of the triple cascode power amplifying device 20 according to an embodiment of the invention. Referring to FIG. 2B, the control circuit 23 includes an operational amplifier OP, a first current source Cs1, a first transistor M1 and a second transistor M2.

The operational amplifier OP receives a first voltage VD1 at its positive input terminal and generates the control voltage VG2 at its output terminal.

The first current source Cs1 is used to supply a first current Id1.

The gate of the second transistor M2 is coupled with the output terminal of the operational amplifier OP to form a third node C. The drain of the second transistor M2 is coupled with the first current source Cs1 and the source of the second transistor M2 is coupled with the negative input terminal of the operational amplifier OP to form a fourth node D.

The drain and the source of the first transistor M1 are coupled to the fourth node D and the ground, respectively. The gate of the first transistor M1 receives a bias voltage V to control the ON/OFF state of the first transistor M1.

Here, the second node B is coupled with the third node C; in addition, the amplification coefficients of the first transistor M1 and the first-stage transistor KM1a (or KM1b) are proportional, e.g., a multiple of K. Here, K is a natural number and less than infinity. The amplification coefficients of the second transistor M2 and the second-stage transistor KM2a (or KM2b) are proportional, e.g., a multiple of K. Please be noted that since the transistors M1 and KM1a (or KM2a) are proportional and the transistors M2 and KM1b (or KM2b) are proportional, e.g., a multiple of K, the left-hand side circuit or the left-hand side circuit of the transistor cascade unit 21, the first current source Cs1 and the transistors M1 and M2 form a current mirror configuration. Accordingly, the currents Kld1 and Kid2 vary according to the current Id1 and have a multiple of K.

Further, the voltage at the second node B is controlled by the control signal VG2 at the third node C. The voltage at the first node A corresponds to the voltage at the fourth node D while the voltage at the fourth node D corresponds to the first voltage VD1. Therefore, the voltage at the first node A can be controlled within a predetermined range by adjusting the first voltage VD1, causing the voltage VD1 (i.e., the voltage across the first-stage transistor KM1a) not to exceed the upper limit of reliability. Likewise, the voltage VD2 (i.e., the voltage across the first-stage transistor KM1b) at the first node A' can be controlled within a predetermined range without exceeding the upper limit of reliability.

In this manner, the invention can control the voltages at connection nodes of the transistor cascode within a predetermined range, thus improving the stability and the reliability of the cascode power amplifying device.

Figure 2C:
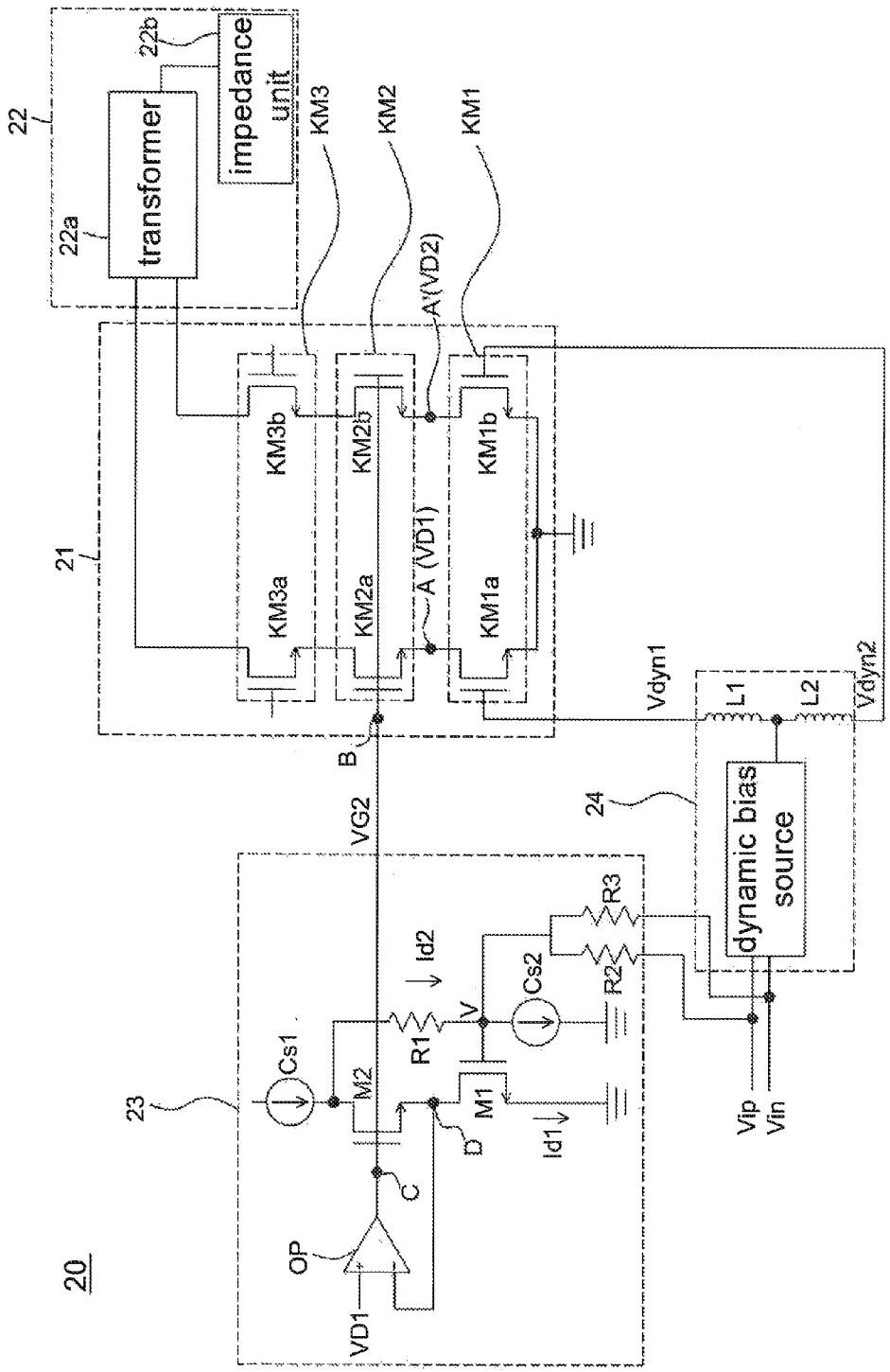
FIG. 2C is a schematic diagram showing the control circuit 23 and the dynamic bias source 24 of the triple cascode power amplifying device 20 according to an embodiment of the invention.

FIG. 2C is a schematic diagram showing the control circuit 23 and the dynamic bias source 24 of the triple cascode power amplifying device 20 according to an embodiment of the invention. By comparison with the embodiment of FIG. 2B, an additional circuit is provided to supply the voltage V to the transistor M1 and a direct bias voltage to the dynamic bias source 24 in FIG. 2C. In this embodiment, the dynamic bias source 24 can additionally include two inductors L1 and L2 to supply dynamic bias voltages Vdyn1 and Vdyn2 to the first transistors KM1a and KM1b. The additional circuit includes a first resistor R1, a second current source Cs2, a second resistor R2 and a third resistor R3.

The first terminal of the first resistor R1 is coupled with the drain of the second transistor M2 and the second terminal of the first resistor R1 is coupled with the gate of the first transistor M1.

The first terminal of the second current source Cs2 is coupled with the second terminal of the first resistor R1 and the second terminal of the second current source Cs2 is grounded.

The first terminal of the second resistor R2 is coupled with the first terminal of the second current source Cs2 and the second terminal of the second resistor R2 is coupled with one of the two dynamic bias voltages Vip and Vin, e.g., Vip as shown in FIG. 2C.

The first terminal of the third resistor R3 is coupled with the first terminal of the second resistor R2 and the second terminal of the third resistor R3 is coupled with the other dynamic bias voltage, e.g., Vin as shown in FIG. 2C.

During operation, the second current Id2 flows through the resistor R1, the current source Cs2 and the resistors R2 and R3 to supply the bias voltage V to drive the first transistor M1. It forces the first current Id1 to flow through the first transistor M1 and causes the current mirror to operate, thereby controlling the voltages at connection nodes of the transistor cascode within a predetermined range. Please note that the gate voltages, particularly for the direct bias voltages, of the first transistors KM1a and KM1b are related to the bias voltage V and are related to the control signal VG2 and the first voltage VD1 as well. In other words, the gate voltages of KM1a and KM1b are provided according to the first voltage VD1 or the control signal VG2.

Figure 3:
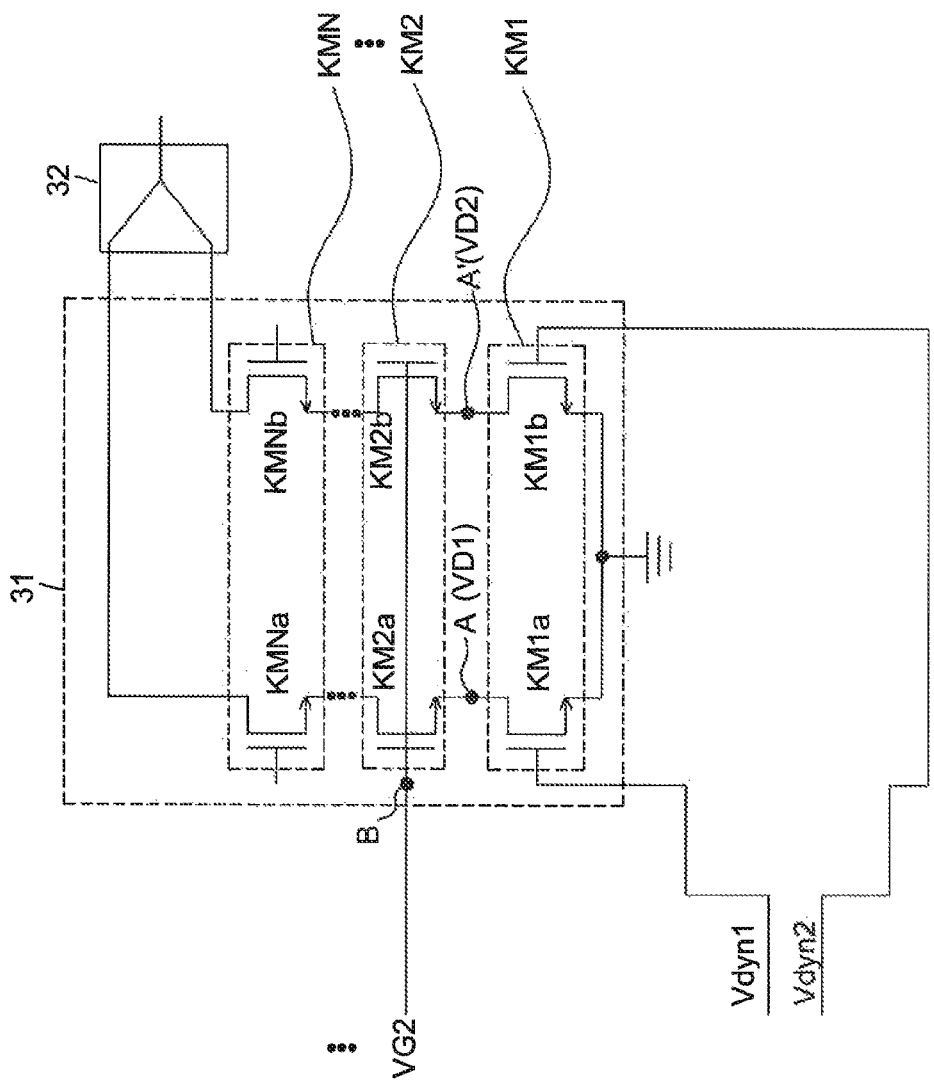
FIG. 3 is a schematic diagram showing an N-stage cascode power amplifying device according to an embodiment of the invention.

Further, the triple cascode power amplifying device is provided by way of example and not limitation of the invention. In other embodiment, the power amplifying device has a multiple stage cascode configuration including a different number of transistors. As shown in FIG. 3, an N-stage cascode power amplifying device 30 comprises N transistor pairs KM1, KM2~KMN. In the N-stage cascode power amplifying device 30, a plurality of control signals VG2 are used to respectively control the voltages across the cascaded transistors, thereby stabilizing and maintaining the voltages at the connection nodes within a predetermined range.

According to an embodiment of the invention, the N-stage cascode power amplifying device (N>=3) uses the transistor pairs to lock the voltages across the transistor pairs, wherein each of the transistor pair includes two corresponding transistors having the same size. Thus, in normal operations, the voltages across the transistor pairs do not exceed the upper limit of reliability, thereby solving the problem in the prior art and improving the stability and the reliability.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A triple cascode power amplifier, comprising:
a first-stage transistor pair comprising two first-stage transistors that respectively receive two dynamic bias voltages with opposite polarities;
a second-stage transistor pair coupled with the first-stage transistor pair to four a first node, the second-stage transistor pair comprising two second-stage transistors coupled with each other to form a second node; and
a third-stage transistor pair coupled with the second-stage transistor pair, the third-stage transistor pair comprising two third-stage transistors for outputting a differential signal;
wherein the first-stage transistor pair and the second-stage transistor pair are low voltage components while the third-stage transistor pair is a high voltage component; and
wherein the power amplifier transforms the differential signal into a single-ended signal for output; and
a control circuit for generating a control signal at the second node to control a voltage at the first node with respect to a ground within a predetermined range;
wherein the control circuit comprises:
an operational amplifier, a first input terminal of which receives a first voltage and an output terminal of which generates the control signal;
a first current source for supplying a current;
a second transistor, a gate of which is coupled with the output terminal of the operational amplifier to form a third node, a drain of which is coupled with the first current source and a source of which is coupled with a second input terminal of the operational amplifier to form a fourth node; and
a first transistor, a drain of which is coupled with the fourth node and a source of which is grounded;
wherein the second node is coupled to the third node;
wherein amplification coefficients of the first transistor and the first-stage transistors are proportional and amplification coefficients of the second transistor and the second-stage transistors are proportional; and
wherein a voltage at the first node varies according to a voltage at the fourth node.

2. The amplifier according to claim 1, further comprising:
a balance to unbalance unit for receiving and transforming the differential signal and generating the single-ended signal.

3. The amplifier according to claim 1, further comprising:
a dynamic bias source for generating the two dynamic bias voltages with opposite polarities.

4. The amplifier according to claim 1, wherein a voltage at the fourth node varies according to an adjustment made to the voltage at the first node.

5. The amplifier according to claim 1, wherein the control circuit further comprises:
a first resistor, a first terminal of which is coupled to the drain of the second transistor and a second terminal of which is coupled to the gate of the first transistor;

a second current source, a first terminal of which is coupled to the second terminal of the first resistor and a second terminal of which is grounded;

a second resistor, a first terminal of which is coupled to the first terminal of the second current source and a second terminal of which is coupled to one of the two dynamic bias voltages; and a third resistor, a first terminal of which is coupled to the first terminal of the second transistor and a second terminal of which is coupled to the other dynamic bias voltage.

6. A multiple stage cascode power amplifier, comprising:

at least one first-stage transistor pair, each comprising two first-stage transistors that respectively receive two dynamic bias voltages with opposite polarities;

at least one second-stage transistor pair coupled with corresponding first-stage transistor pair to form at least one first node, each second-stage transistor pair comprising two second-stage transistors coupled with each other to form a second node; and a third-stage transistor pair coupled with one of the at least one second-stage transistor pair, the third-stage transistor pair comprising two third-stage transistors for outputting a differential signal;

wherein the at least one first-stage transistor pair and the at least one second-stage transistor pair are low voltage components while the third-stage transistor pair is a high voltage component;

wherein each of the second-stage transistors receives a control signal at a corresponding second node to control a voltage across a corresponding first-stage transistor within a predetermined range; and wherein the power amplifier transforms the differential signal into a single-ended signal for output; and a control circuit for generating the control signal at the second node;

wherein the control circuit comprises:

an operational amplifier, a first input terminal of which receives a first voltage and an output terminal of which generates the control signal;

a first current source for supplying a current;

a second transistor, a gate of which is coupled with the output terminal of the operational amplifier to form a third node, a drain of which is coupled with the first current source and a source of which is coupled with a second input terminal of the operational amplifier to form a fourth node; and a first transistor, a drain of which is coupled with the fourth node and a source of which is grounded;

wherein the second node is coupled to the third node;

wherein amplification coefficients of the first transistor and the first-stage transistors are proportional and amplification coefficients of the second transistor and the second-stage transistors are proportional; and wherein a voltage at the first node varies according to a voltage at the fourth node.

7. A triple cascode power amplifier, comprising:

a first-stage transistor pair comprising two first-stage transistors, gates of which respectively receive a first gate voltage;

a second-stage transistor pair coupled with the first-stage transistor pair, the second-stage transistor pair comprising two second-stage transistors; and a third-stage transistor pair coupled with the second-stage transistor pair, the third-stage transistor pair comprising two third-stage transistors for outputting a differential signal;

wherein the first-stage transistor pair and the second-stage transistor pair are low voltage components while the third-stage transistor pair is a high voltage component; and wherein gates of the two second-stage transistors receive a control signal to control voltages across the two first-stage transistors within a predetermined range, and wherein the first gate voltages are provided according to the control signal; and a control circuit for generating the control signal at the second node;

wherein the control circuit comprises:

an operational amplifier, a first input terminal of which receives a first voltage and an output terminal of which generates the control signal;

a first current source for supplying a current;

a second transistor, a gate of which is coupled with the output terminal of the operational amplifier to form a third node, a drain of which is coupled with the first current source and a source of which is coupled with a second input terminal of the operational amplifier to form a fourth node; and a first transistor, a drain of which is coupled with the fourth node and a source of which is grounded;

wherein the second node is coupled to the third node;

wherein amplification coefficients of the first transistor and the first-stage transistors are proportional and amplification coefficients of the second transistor and the second-stage transistors are proportional; and wherein a voltage at the first node varies according to a voltage at the fourth node.

8. The amplifier according to claim 7, further comprising:

a balance to unbalance unit for receiving and transforming the differential signal and generating a single-ended signal.

* * * * *